United States Patent
Kuroda et al.

(10) Patent No.: US 9,698,034 B2
(45) Date of Patent: Jul. 4, 2017

(54) SUBSTRATE STORAGE CONTAINER AND SUBSTRATE STORAGE CONTAINER MOUNTING TABLE

(71) Applicant: Kabushiki Kaisha Toshiba, Minato-ku, Tokyo (JP)

(72) Inventors: Yuuichi Kuroda, Mie (JP); Masaki Hirano, Mie (JP); Tsunekazu Yasutake, Kanagawa (JP); Rempei Nakata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/656,182

(22) Filed: Mar. 12, 2015

(65) Prior Publication Data

US 2016/0035606 A1 Feb. 4, 2016

(30) Foreign Application Priority Data

Jul. 31, 2014 (JP) .................. 2014-156806

(51) Int. Cl.
*H01L 21/673* (2006.01)
*H01L 21/677* (2006.01)

(52) U.S. Cl.
CPC .. *H01L 21/67376* (2013.01); *H01L 21/67775* (2013.01)

(58) Field of Classification Search
CPC ................................. H01L 21/67386
USPC ................. 318/400.37, 400.01, 700
See application file for complete search history.

(56) References Cited

U.S. PATENT DOCUMENTS

| | | | |
|---|---|---|---|
| 6,473,996 B1 | 11/2002 | Tokunaga | |
| 6,808,352 B2 | 10/2004 | Seita | |
| 7,326,565 B2* | 2/2008 | Yokoi | C12M 23/48 312/236 |
| 7,553,374 B2* | 6/2009 | Hamada | H01L 21/6715 118/313 |
| 7,714,979 B2* | 5/2010 | Yamamoto | H01L 21/6715 355/27 |
| 2001/0055522 A1 | 12/2001 | Kaneda et al. | |
| 2003/0012625 A1 | 1/2003 | Rosenquist | |
| 2007/0009345 A1 | 1/2007 | Hall et al. | |
| 2009/0092468 A1 | 4/2009 | Oyama et al. | |
| 2011/0215028 A1 | 9/2011 | Igarashi et al. | |

FOREIGN PATENT DOCUMENTS

| | | |
|---|---|---|
| JP | 11-145245 | 5/1999 |
| JP | 2001/250853 A | 9/2001 |
| JP | 2001/358197 A | 12/2001 |
| JP | 2004/537850 A | 12/2004 |
| JP | 2006-140516 | 6/2006 |
| JP | 2011-159833 | 8/2011 |

(Continued)

*Primary Examiner* — David S Luo
(74) *Attorney, Agent, or Firm* — Finnegan, Henderson, Farabow, Garrett & Dunner, LLP

(57) ABSTRACT

In accordance with an embodiment, a substrate storage container includes first and second cases, a lid and a moving unit. The first case is provided with an opening to take in or out a substrate. The lid closes the opening. The second case can move in a first direction crossing a surface of the first case. The opening is provided on the surface. The moving unit moves the second case in the first direction in response to the opening of the lid.

7 Claims, 11 Drawing Sheets

(56) References Cited

FOREIGN PATENT DOCUMENTS

| JP | 2013-120760 | 6/2013 |
| JP | 2013/153188 A | 8/2013 |
| WO | WO-2013/186912 | 12/2013 |

\* cited by examiner

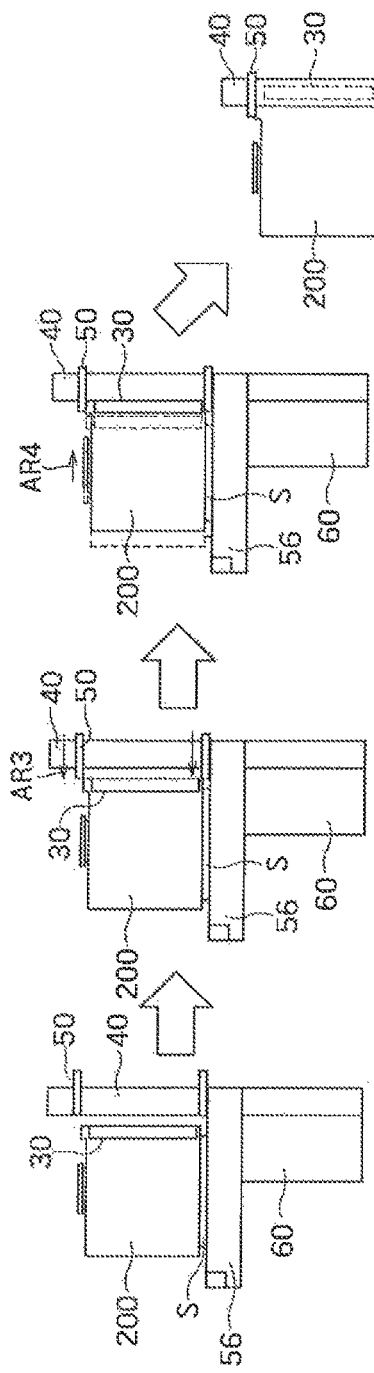

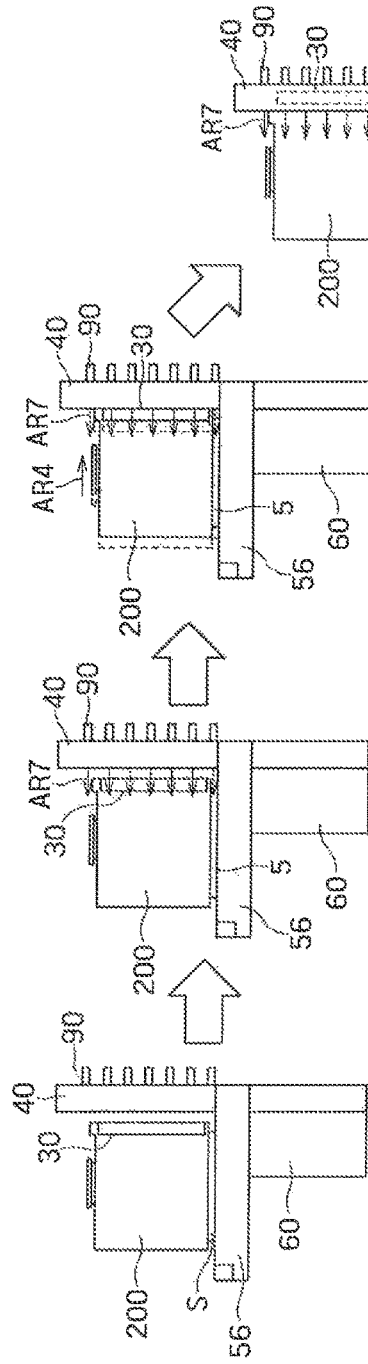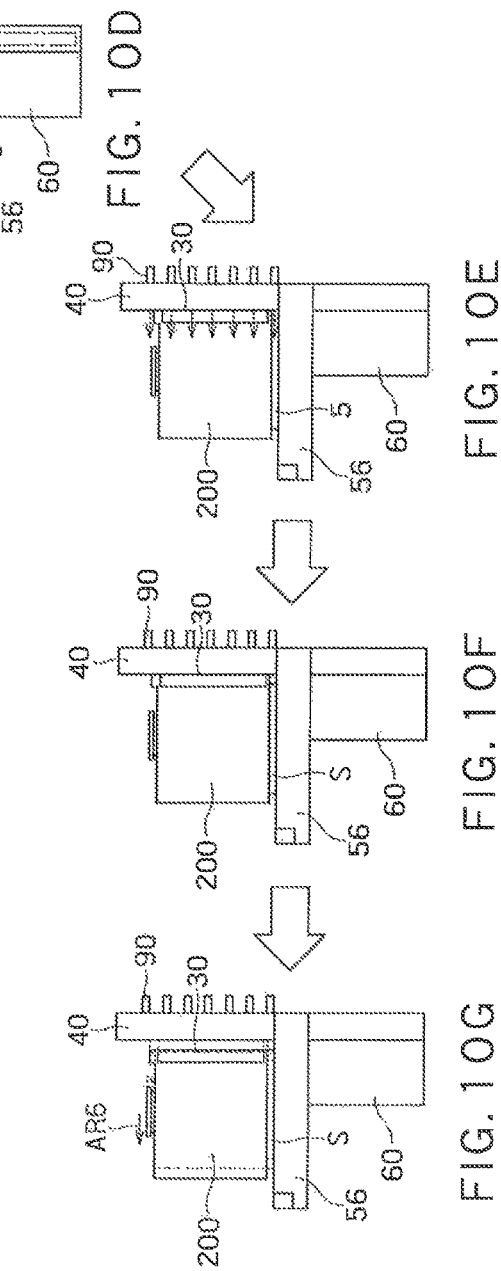

SUBSTRATE STORAGE CONTAINER AND SUBSTRATE STORAGE CONTAINER MOUNTING TABLE

CROSS REFERENCE TO RELATED APPLICATIONS

This application is based upon and claims the benefit of priority from the prior Japanese Patent Application No. 2014-156806, filed on Jul. 31, 2014, the entire contents of which are incorporated herein by reference.

FIELD

Embodiments described herein relate generally to a substrate storage container and a substrate storage container mounting table.

BACKGROUND

A positional relation when a substrate storage container (front open unified pod, hereinafter suitably referred to as a "FOUP") has docked with a substrate storage container mounting table is defined by the semiconductor equipment and materials international (SEMI) standard. Due to the molding dimension tolerance of the FOUP and the adjustment error of a load port, a clearance of a maximum of 1 mm is produced between the front surface of a lid of the FOUP and the front surface of an interface part of the substrate storage container mounting table. The air pressure in the FOUP is lower than the air pressure in a clean room. Therefore, if the lid of the FOUP is opened after docking, the polluted clean room atmosphere is brought into the FOUP from the clearance, and airborne particles may adhere to a product substrate and lead to a product failure.

BRIEF DESCRIPTION OF THE DRAWINGS

In the accompanying drawings:

FIGS. 5A to 5G are explanatory diagrams of one operational example of the substrate storage container mounting table shown in FIGS. 2A and 2B;

FIGS. 10A to 10G are explanatory diagrams of one operational example of the substrate storage container mounting table shown in FIGS. 8A and 8B.

DETAILED DESCRIPTION

In accordance with an embodiment, a substrate storage container includes first and second cases, a lid and a moving unit. The first case is provided with an opening to take in or out a substrate. The lid closes the opening. The second case can move in a direction crossing a surface of the first case. The opening is provided on the surface. The moving unit moves the second case in the direction in response to the opening of the lid.

Embodiments will now be explained with reference to the accompanying drawings. Like components are provided with like reference signs throughout the drawings and repeated descriptions thereof are appropriately omitted. It is to be noted that the accompanying drawings illustrate the invention and assist in the understanding of the illustration and that the shapes, dimensions, and ratios and so on in each of the drawings may be different in some parts from those in an actual apparatus. A skilled person can take into consideration the following explanation and known arts to suitably design and change these differences.

(A) Substrate Storage Container

Figure 1A:
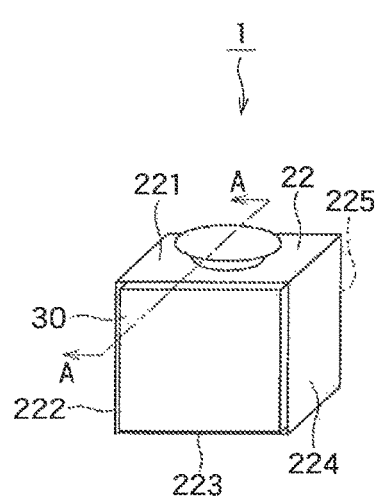
FIGS. 1A to 1D are examples of diagrams showing the general configuration of a substrate storage container according to one embodiment.
Figure 1B:
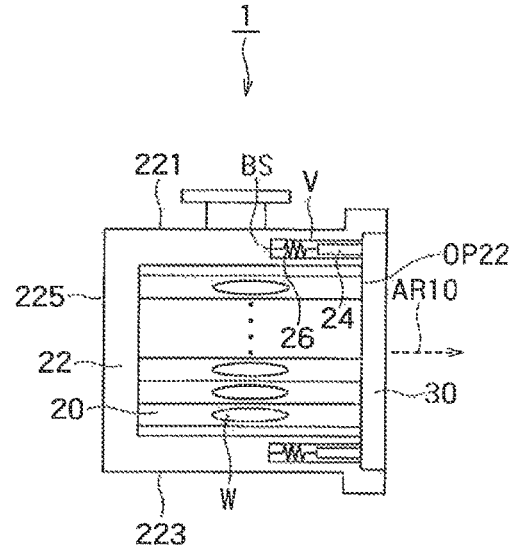
Figure 1C:
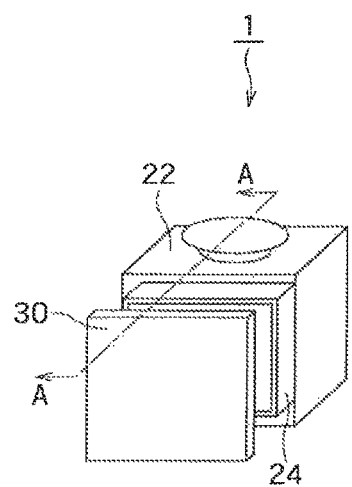
Figure 1D:
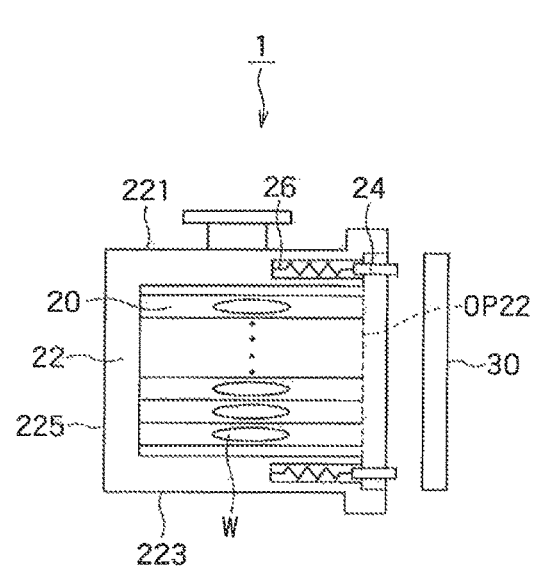

FIGS. 1A to 1D are examples of diagrams showing the general configuration of a substrate storage container according to one embodiment. FIG. 1A is a perspective view showing the exterior of the substrate storage container according to the present embodiment. FIG. 1B is a sectional view taken along the line A-A in FIG. 1A. FIG. 1C is a perspective view showing one operational example of the substrate storage container according to the present embodiment. FIG. 1D is a sectional view taken along the line A-A in FIG. 1A.

A FOUP 1 according to the present embodiment includes cases 22 and 24, a lid 30, and an elastic member (moving unit) 26.

The case 22 corresponds to, for example, a first case in the present embodiment. The case 22 is provided an opening 22 through which a semiconductor wafer W is taken in and out. The case 22 has an approximately rectangular three-dimensional shape defined by five plates 221 to 225 and the inner space of the case 22 constitutes a substrate storage unit 20 to contain the semiconductor wafer W. A void V which serves a space that can store the elastic member 26 and the case 24 is formed in the part of the plates 221 to 225 of the case 22 around the opening 22.

The case 24 corresponds to, for example, a second case in the present embodiment. The case 24 is coupled to the elastic member 26 to constitute an extendable mechanism together with the elastic member 26. The lid 30 is attached so as to block an opening OP22 of the case 22 over the substrate storage unit 20, and the case 24 is thereby stored in the void V. As a result of the attachment of the lid 30, the substrate storage unit 20 is sealed, and the substrate storage unit 20 becomes a tightly closed space.

One end of the elastic member 26 is attached to a far-side bottom surface BS of the void V, and the other end of the elastic member 26 is fixedly attached to one far-side surface of the case 24. Therefore, when the lid 30 is attached, the case 24 is pushed by the elastic member 26 to be stored in the void V while being pressed against the inner circumferential surface of the lid 30.

In the present embodiment, a spring is used as the elastic member 26. However, the elastic member 26 is not limited to this, and may be any material such as rubber that can push the case 24.

Now, one operational example of the substrate storage container 1 according to the present embodiment is described with reference to FIG. 1C, FIG. 1D and FIGS. 11A to 11E.

Figure 11A:
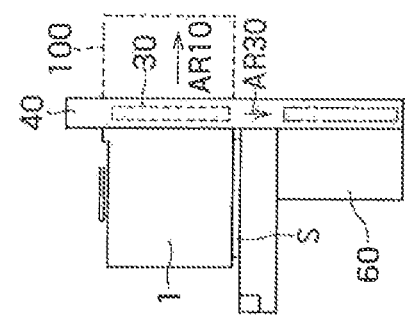
FIGS. 11A to 11E are explanatory diagrams of one operational example of the substrate storage container mounting table shown in FIGS. 1A and 1B.

The FOUP 1 storing the semiconductor wafer W and closed by the lid 30 is carried to a substrate storage container mounting table attached to manufacturing equipment 100 as shown in FIG. 11A by, for example, an automatic carrying vehicle (not shown) or a person and is mounted on a FOUP stage S.

Figure 11B:
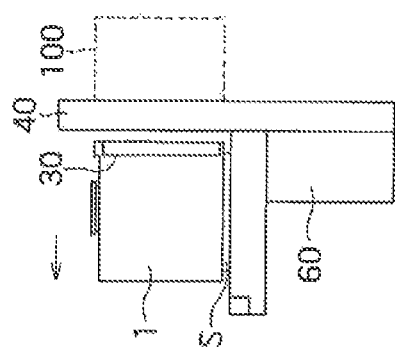

As shown in FIG. 11B, the FOUP 1 placed on the substrate storage container mounting table (see FIGS. 2A and 2B) is moved on a base 60 toward the manufacturing equipment 100 at the start of processing until the FOUP 1 reaches in the vicinity of the wall surface of the interface part 40 (this state is hereinafter referred to as a "docked state").

Figure 11C:
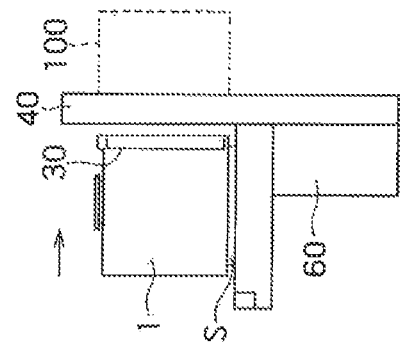

Next, at the same time when a door (not shown) of the interface part is opened, the FOUP 1 is opened by removing and moving the lid 30, for example, downward (see arrow AR30) by a lid opener/closer (not shown) as shown in FIG. 11C.

Simultaneously with the opening of the lid 30, the case 24 placed in the FOUP 1 is pushed by the elastic member 26 to start sliding in the void V toward the interface part 40. As shown in FIG. 1C, the case 24 has a frame structure covering the circumferential edge of the opening OP22 of the case 22. Therefore, the case 24 moves a given distance in the direction designated by the arrow AR10 as shown in FIG. 11C as a result of the extension of the elastic member 26. The length of the case 24 is 1 mm or more, and thus the clearance between the FOUP 1 and the interface part 40 is closed. Thus, the inside of the FOUP 1 is cut off from the outside air in a clean room. In this state, the semiconductor wafer W in the FOUP 1 is carried into the manufacturing equipment and processed. In the present Embodiment, the direction designated by the reference numeral "AR10" corresponds to, for example, a direction orthogonal to an opening surface of the opening.

Figure 11D:
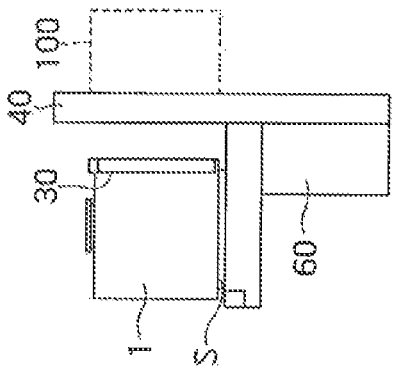

After the processing of the semiconductor wafer W by the manufacturing equipment has finished, the lid 30 of the FOUP 1 is closed as shown in FIG. 11D by the lid opener/closer (not shown). At the same time, the case 24 is pressed a given distance back into the void V via the lid 30, and thereby stored in the case 22 (see FIG. 1B).

Figure 11E:
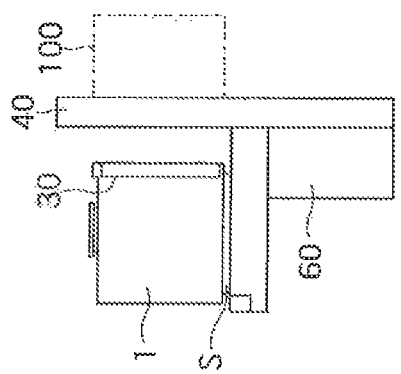

As shown in FIG. 11E, the FOUP 1 having the lid 30 closed moves on the base 60 to the position where the FOUP 1 has been mounted before processing (this state is hereinafter referred to as "undocked state"). The FOUP 1 which has returned to the original position is carried to manufacturing equipment for the next processing step.

Although the void V is provided in the case 22 and the extendable mechanism is placed in the void V in the aspect described in the above embodiment, a blocking mechanism is not at all limited to this aspect. As long as the case 24 is placed outside the substrate storage unit 20, other configuration may be applied to the case 24 in such a manner that its sliding does not have any effect on the semiconductor wafer W.

The substrate storage container according to at least one embodiment described above has the elastic member 26 and the case 24 which close the air gap between the substrate storage container and the external manufacturing equipment produced by the opening of the lid 30, so that it is possible to prevent the polluted outside air from coming into the FOUR (B) Substrate Storage Container Mounting Table (1) Embodiment 1

Figure 2A:
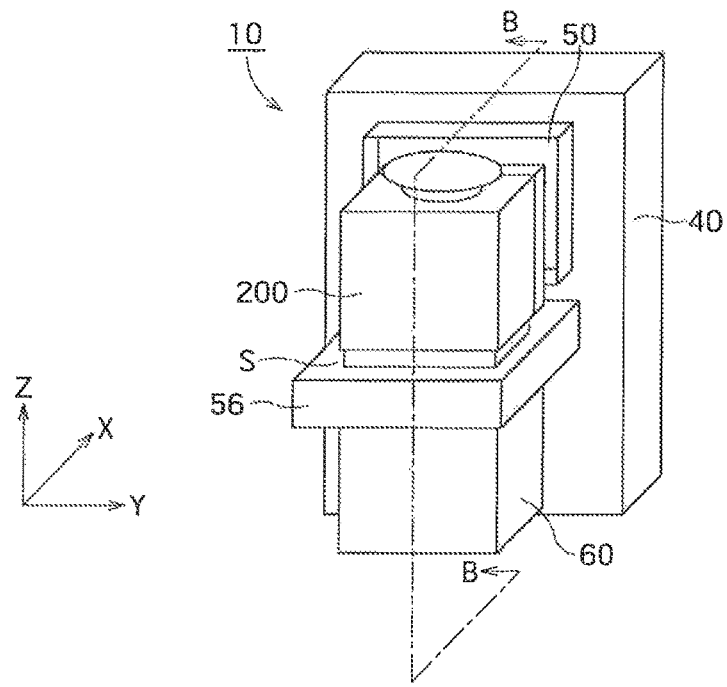
FIGS. 2A and 2B are examples of diagrams showing a substrate storage container mounting table according to Embodiment 1.
Figure 2B:
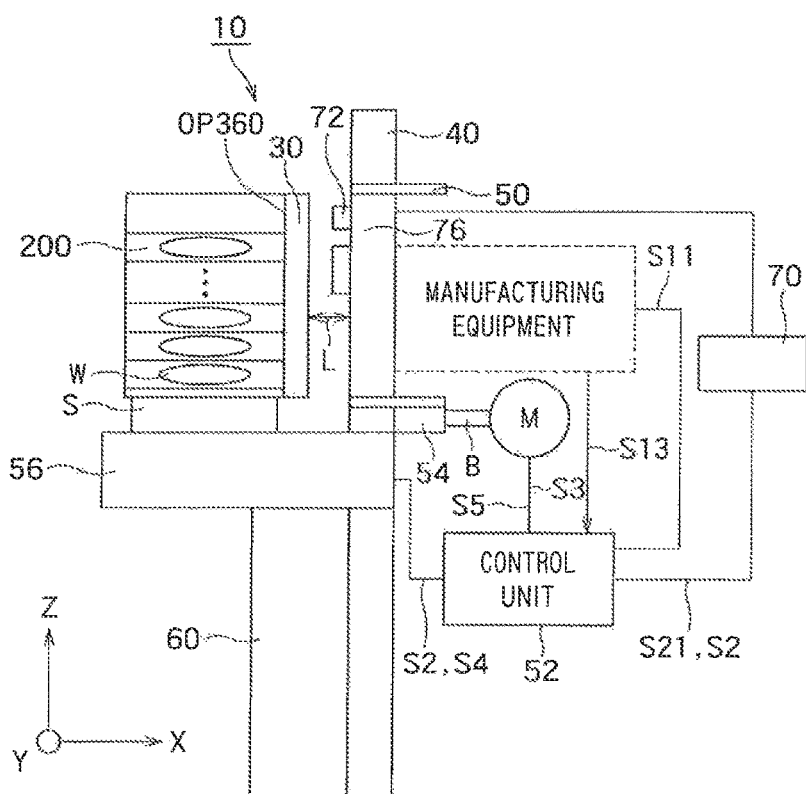

FIGS. 2A and 2B are examples of diagrams showing a substrate storage container mounting table according to Embodiment 1. FIG. 2A is an example of a perspective view of a substrate storage container mounting table 10 according to the present embodiment. FIG. 2B is an example of a sectional view taken along the line B-B in FIG. 2A.

As shown in FIGS. 2A and 2B, the substrate storage container mounting table 10 according to the present embodiment includes a base 60, a FOUP stage moving unit 56, a FOUP stage S, an interface part 40, a blocking plate 50, a blocking plate stage 54, a motor M, a judging unit 70, a sensor 72, a buffer material 76, and a control unit 52.

The FOUP stage S is provided on the FOUP stage moving unit 56, and a FOUP 200 is mounted on the upper surface of the FOUP stage S. The FOUP stage moving unit 56 is connected to the control unit 52, and moves the FOUP stage S in, for example, the carrying-in/out direction (X-direction) of the semiconductor wafer W in accordance with a control signal S2 provided from the control unit 52. In the present embodiment, the FOUP stage S and the FOUP stage moving unit 56 correspond to, for example, a movement mechanism.

The interface part 40 serves as an interface to the external manufacturing equipment, and is fixed to the stage moving unit 56 and the FOUP mounting table 60 so that the interface part 40 is removable by an unshown engagement member or fitting unit in the present embodiment. A door (not shown) which is actuated in response to the opening and closing of the lid 30 is attached to a position in the surface area of the interface part 40 corresponding to an opening OP360 of the FOUP 200.

The blocking plate 50 is configured by a hollow frame body having a size that can cover the outer circumferential surface of the FOUP 200. The blocking plate 50 is attached to the interface part 40 movably in a direction (X-direction) perpendicular to the opening OP360 of the FOUP 200. The blocking plate stage 54 is attached to a partial area of the blocking plate 50, in the present embodiment, a bottom surface area, and the blocking plate 50 moves in the X-direction in response to the rotation of the motor M.

In the present embodiment, the motor M is coupled to the blocking plate 50 via a ball screw B, and is also connected to the control unit 52. The motor M operates in accordance with a control signal S from the control unit 52, and rotates the ball screw B.

Figure 3A:
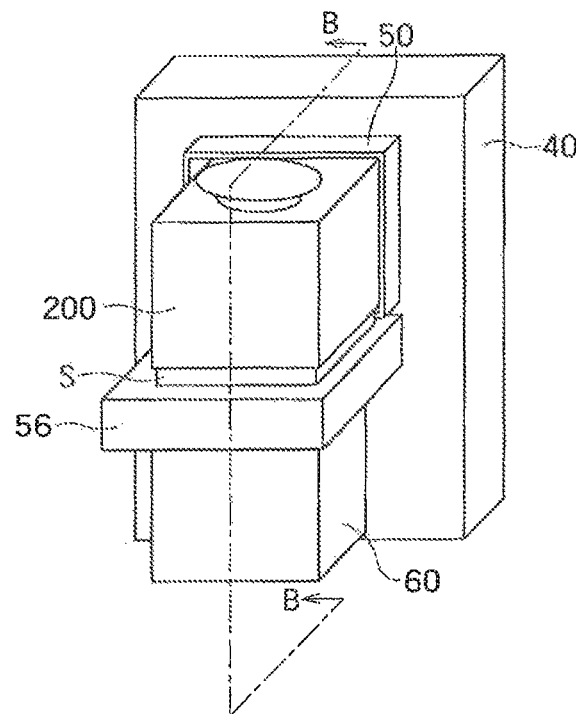
FIGS. 3A and 3B are explanatory diagrams of one example of a method of moving a blocking plate of the substrate storage container mounting table shown in FIGS. 2A and 2B.
Figure 3B:
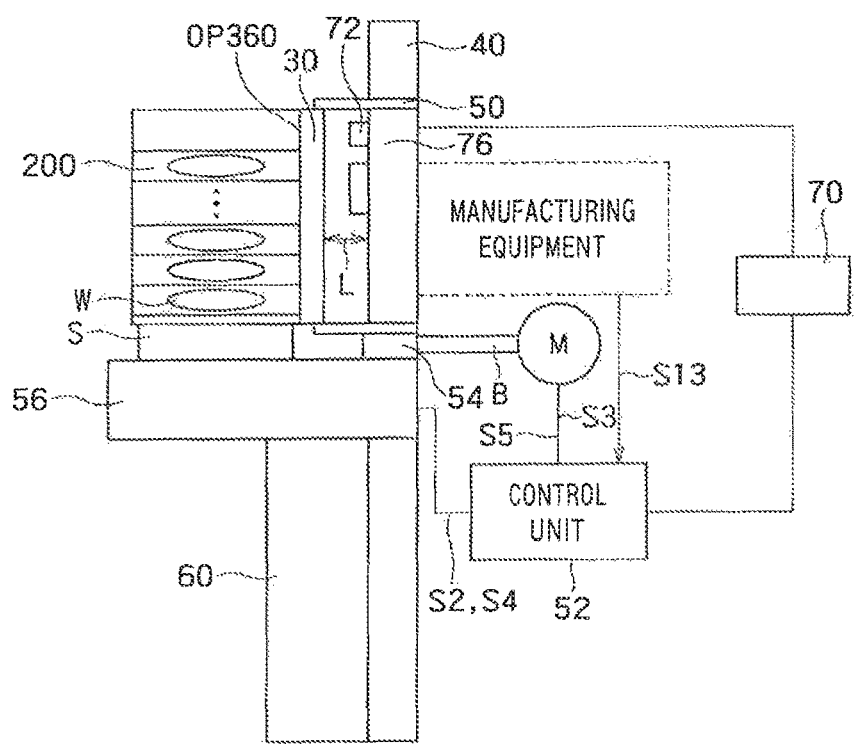

FIG. 3A is an example of a perspective view showing how the blocking plate 50 has moved toward the opening OP360 of the FOUP 200 in response to the rotation of the motor M. FIG. 3B is an example of a sectional view taken along the line B-B in FIG. 3A.

Figure 4B:
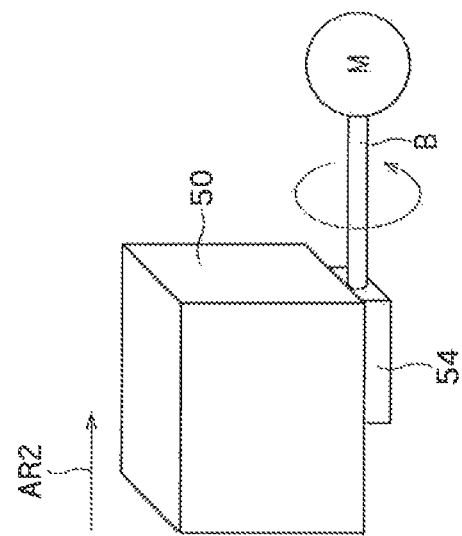
FIGS. 4A and 4B are explanatory diagrams of one example of a mechanism to move the blocking plate stage of the substrate storage container mounting table shown in FIGS. 2A and 2B.
Figure 4A:
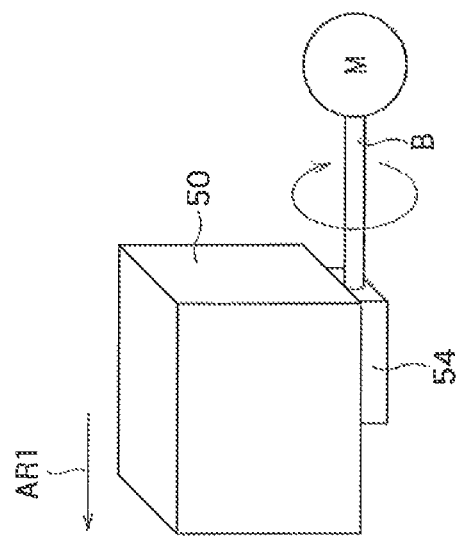

FIGS. 4A and 4B are explanatory diagrams of one example of a mechanism to move the blocking plate stage 54. The blocking plate stage 54 attached to, for example, the bottom surface of the blocking plate 50 is provided with a screw hole (not shown), and the ball screw B is inserted into this screw hole. The ball screw B is coupled to the rotation shaft of the motor M via an unshown gear.

For example, in the example of FIG. 4A, the blocking plate 50 moves in the direction of an arrow AR1 if the ball screw B rotates clockwise in response to the rotation of the motor M. For example, in the example of FIG. 4B, the blocking plate 50 moves in the direction of an arrow AR2 opposite to the arrow AR1 if the ball screw B rotates counterclockwise in response to the rotation of the motor M.

In the present embodiment, the blocking plate 50, the blocking plate stage 54, the ball screw B, the motor M, and the control unit 52 correspond to, for example, a blocking mechanism.

The sensor 72 is buried in an area facing the lid 30 of the FOUP 200 within the surface of the interface part 40. The sensor 72 is configured by a distance sensor or a pressure sensor. When the sensor 72 is a distance sensor, the sensor 72 measures a distance L (see FIG. 3B) between the lid 30 and the interface part 40, and sends the measurement result to the judging unit 70. When the sensor 72 is a pressure sensor, the sensor 72 measures the pressure between the interface part 40 and an external member, in the present embodiment, the pressure between the interface part 40 and the lid 30, and sends the measurement result to the judging unit 70.

The judging unit 70 judges from the measurement result sent from the sensor 72 whether the lid 30 of the FOUP 200 has closely abutted on the wall surface of the interface part 40, and then the judging unit 70 sends the judgment result to the control unit 52. When moving the FOUP 200 toward the manufacturing equipment, the control unit 52 controls the operation of the FOUP stage S in accordance with the judgment result from the judging unit 70. Although described later in more detail, the control unit 52 continues the moving of the FOUP stage S before receiving the judgment result indicating that the lid 30 has closely abutted on the wall surface of the interface part 40. Immediately after receiving this judgment result that indicates the abutment, the control unit 52 generates a signal S4 to stop the moving and then sends the control unit 52 to the stage moving unit 56, thereby stopping the moving of the FOUP stage S.

Now, one operational example of the substrate storage container mounting table 10 according to the present embodiment is described with reference to FIG. 5A to FIG. 5G.

The substrate storage container mounting table 10 according to the present embodiment is attached to the external manufacturing equipment in use during operation.

The FOUP 200 storing the semiconductor wafer W is carried to the substrate storage container mounting table 10 by, for example, the automatic carrying vehicle (not shown) or the person, and mounted on the FOUP stage S and then waits for processing (FIG. 5A).

When a signal S11 (see FIG. 2B) saying that the manufacturing equipment has prepared for processing is sent to the control unit 52 from the manufacturing equipment or by an operator, the control unit 52 generates a control signal S1 and sends the control signal S1 to the motor M and the stage moving unit 56. The motor M rotates the ball screw B in response to the control signal S1 (FIG. 2B). As a result, the blocking plate 50 is moved a predetermined distance in a direction indicated by an arrow AR3 by the blocking plate stage 54 (FIG. 5B). At the completion of the movement, the motor M sends a signal S3 indicating the completion of the movement to the control unit 52. Thus, the lid 30 is covered with the blocking plate 50.

In response to the signal S3, the control unit 52 generates the control signal S2 and sends the control signal S2 to the stage moving unit 56. The stage moving unit 56 which has received the control signal S2 moves the FOUP 200 toward the manufacturing equipment as indicated by an arrow AR4 in FIG. 5C. The stage moving unit 56 stops the movement in response to the stop signal S4 from the control unit 52 at the stage where the FOUP 200 has abutted on the wall surface of the interface part 40 (docked state).

Figure 6:
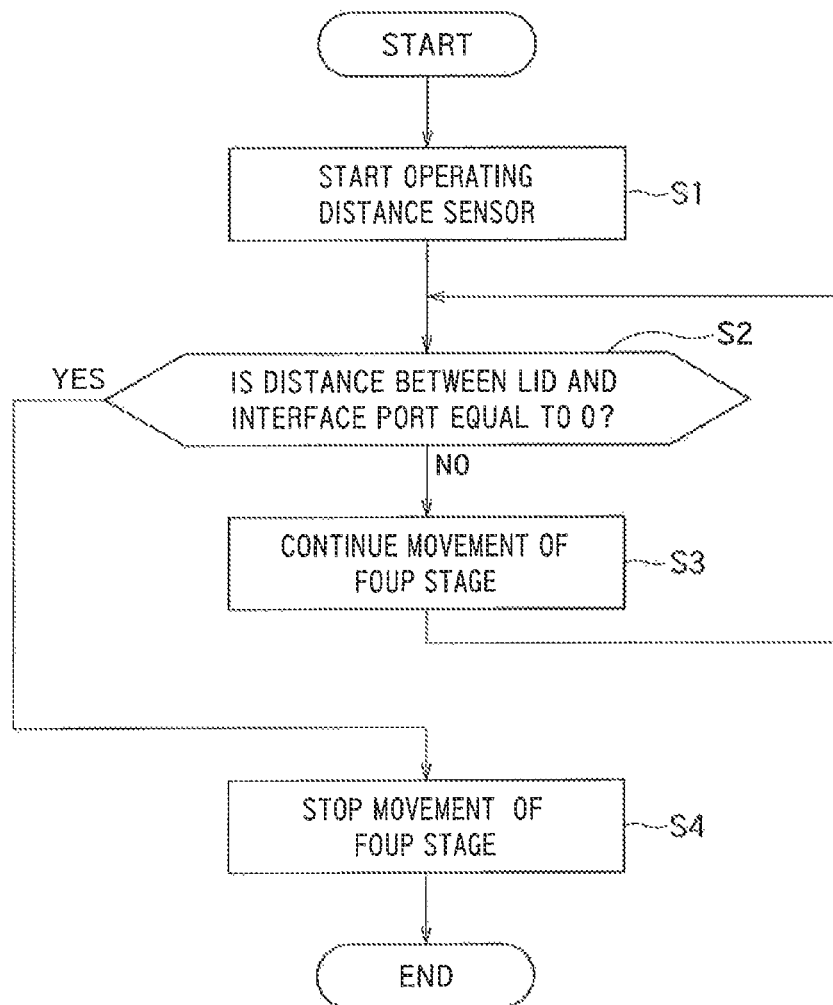
FIG. 6 is an example of a diagram showing a control flow when a sensor of the substrate storage container mounting table shown in FIGS. 2A and 2B is a distance sensor.
Figure 7:
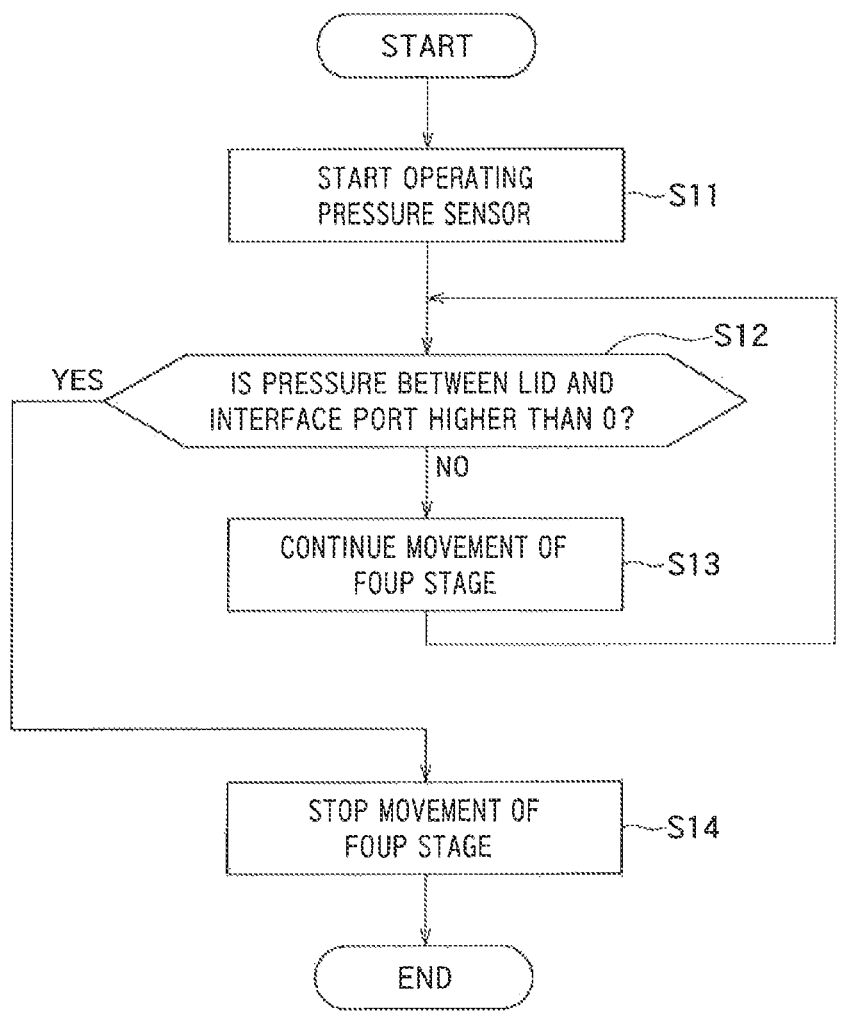
FIG. 7 is an example of a diagram showing a control flow when the sensor of the substrate storage container mounting table shown in FIGS. 2A and 2B is a pressure sensor.

The judging unit 70 judges whether the FOUP 200 has abutted on the wall surface of the interface part 40 on the basis of the measurement result from the sensor 72. FIG. 6 shows a control flow when the sensor 72 is a distance sensor. FIG. 7 shows a control flow when the sensor 72 is a pressure sensor.

When the sensor 72 is a distance sensor, the sensor 72 measures the distance L (see FIG. 3B) between the lid 30 and the interface part 40. This distance measurement is started, for example, when the control signal S2 instructing the stage moving unit 56 to start movement is sent to the sensor 72 from the control unit 52 via the judging unit 70 (FIG. 6, step S1). The measurement result is sent to the judging unit 70, and the judging unit 70 judges whether the distance L between the lid 30 and the interface part 40 is 0 (step S2).

No new signal is sent to the control unit 52 from the judging unit 70 until the distance L becomes 0 (step S2, No). Therefore, the movement of the FOUP stage S by the stage moving unit 56 continues (step S3).

If the distance L becomes 0 (step S2, Yes), a signal S21 informing of this fact is sent to the control unit 52 from the judging unit 70. The control unit 52 which has received the signal S21 generates a signal S4 to stop the movement of the FOUP stage 5, and then sends the signal S4 to the stage moving unit 56 (step S3). In response to the signal S4, the stage moving unit 56 stops the movement of the FOUP stage S (step S4).

When the sensor 72 is a pressure sensor, the sensor 72 measures the pressure resulting from the contact between the lid 30 and the interface part 40. This pressure measurement is also started, for example, when the control signal S2 instructing the stage moving unit 56 to start movement is sent to the sensor 72 from the control unit 52 via the judging unit 70 (FIG. 7, step S1). The measurement result is sent to the judging unit 70, and the judging unit 70 judges whether the pressure between the lid 30 and the interface part 40 is 0 (step S12).

No new signal is sent to the control unit 52 from the judging unit 70 until the pressure increases to more than 0 due to the contact between the lid 30 and the interface part 40 (step S12, No). Therefore, the movement of the FOUP stage S by the stage moving unit 56 continues (step S13).

If the pressure increases to more than 0 (step S12, Yes), the signal S21 (see FIG. 2B) informing that the lid 30 and the interface part 40 have come into contact is sent to the control unit 52 from the judging unit 70. The control unit 52 which has received the signal S21 generates the signal S4 (see FIG. 2B) to stop the movement of the FOUP stage S, and then sends the signal S4 to the stage moving unit 56, In response to the signal S4, the stage moving unit 56 stops the moving of the FOUP stage S (step S14).

As shown in FIG. 2B, the buffer material 76 is attached to the wall surface of the interface part 40 on the side of the FOUP 200. Therefore, impact resulting from the collision between the lid 30 and the interface part 40 is eased even when a slight time lag is produced between the output of the signal S21 from the judging unit 70 and the stopping of the operation of the stage moving unit 56. In the present embodiment, the sensor 72, the judging unit 70, and the control unit 52 correspond to, for example, a distance adjustment mechanism.

Returning to FIG. 5, the lid 30 of the FOUP 200 is opened by the lid opener/closer (not shown) after the FOUP 200 has moved to the wall surface of the manufacturing equipment (FIG. 5D).

Thus, the blocking plate 50 is pushed toward the FOUP 200 before the lid 30 of the FOUP 200 is opened, so that the clearance between the manufacturing equipment and the FOUP 200 is closed.

The semiconductor wafer W in the FOUP 200 is carried into the manufacturing equipment, and processed in the manufacturing equipment. If the processing of the semiconductor wafer W is finished and the semiconductor wafer W is again stored in the FOUP 200, the lid 30 is closed by the opener/closer (not shown) (FIG. 5E).

The manufacturing equipment generates a signal S13 (FIG. 3B) informing of the completion of the lid closing operation by the opener/closer (not shown), and sends the signal S13 to the control unit 52. Accordingly, the control unit 52 generates the control signal S3 to rotate the motor M, moves the blocking plate 50 toward the manufacturing equipment by the blocking plate stage 54 as indicated by an arrow AR5, and stores the blocking plate 50 in the original position (FIG. 5F). When the movement to the original position has completed, the motor M sends, to the control unit 52, a signal S5 (FIG. 3B) informing of the completion of the movement.

The control unit 52 which has received the signal S5 generates the control signal S4 and sends the signal S4 to the stage moving unit 56. The stage moving unit 56 moves the FOUP stage S in a direction indicated by an arrow AR6, so that the FOUP 200 returns to the original position (undocked state) (FIG. 5G). The FOUP 200 which has returned to the original position is carried to manufacturing equipment for the next processing step.

According to the present embodiment, the moving of the stage moving unit 56 is controlled on the basis of the measurement result by the sensor 72, so that the distance gap between the lid 30 and the interface part 40 can be eliminated. This, in addition to the blocking by the blocking plate 50, makes it possible to further prevent the entrance of the polluted clean room atmosphere. Since the buffer material 76 is provided in the interface part 40, molding errors and roughness, if any, in the body surface of the FOUP 200 which contacts the interface part 40 can be absorbed.

(2) Embodiment 2

Figure 8A:
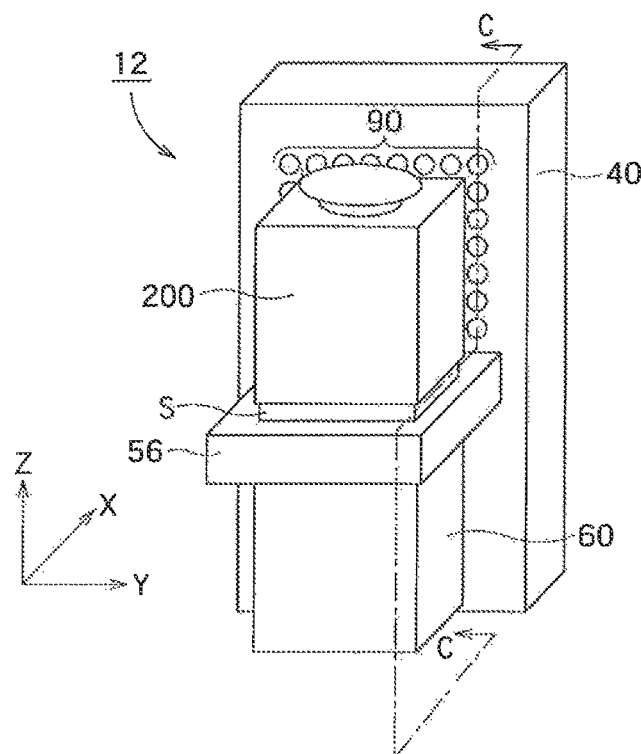
FIGS. 8A and 8B are examples of diagrams showing a substrate storage container mounting table according to Embodiment 2.
Figure 8B:
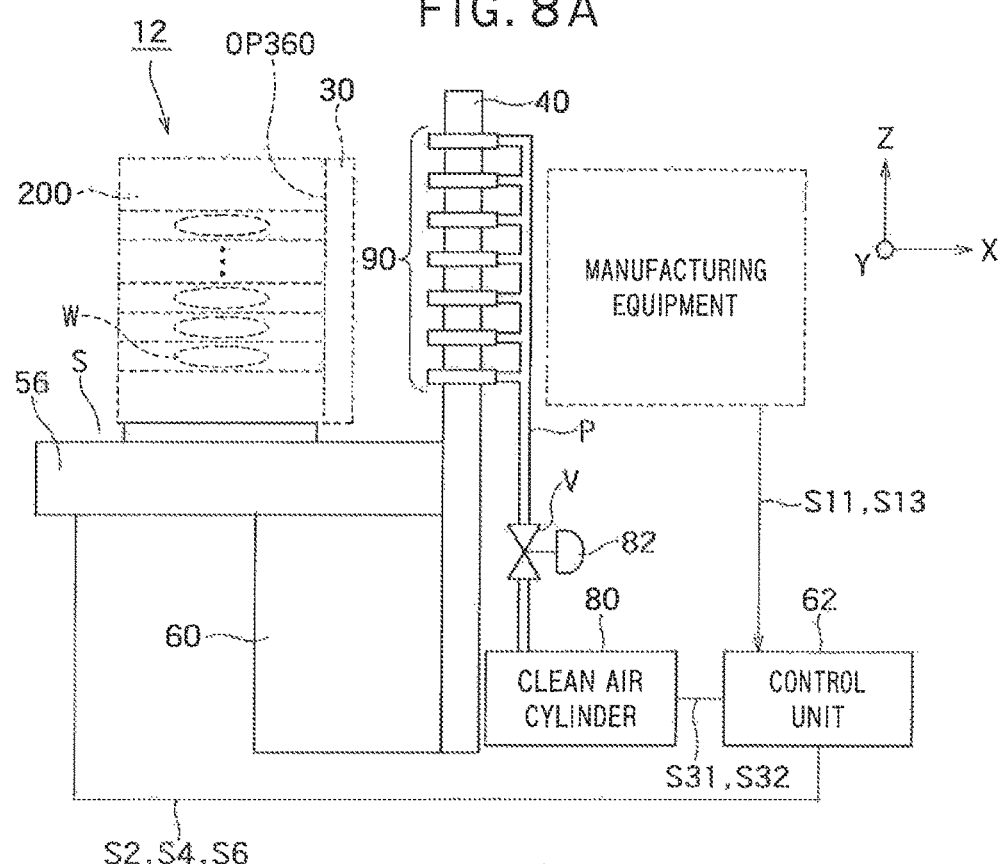

FIGS. 8A and 8B are example of diagrams showing a substrate storage container mounting table according to Embodiment 2. FIG. 8A is an example of a perspective view of a substrate storage container mounting table 12 according to the present embodiment. FIG. 8B is an example of a sectional view taken along the line CC in FIG. 8A.

The substrate storage container mounting table 12 according to the present embodiment includes a base 60, a FOUP stage moving unit 56, a FOUP stage 5, an interface part 40, air blow holes 90, a pipe P, a clean air cylinder 80, a valve V, a valve 82, and a control unit 62.

The FOUP stage S is provided on the FOUP stage moving unit 56, and a FOUP 200 is mounted on the upper surface of the FOUP stage S. The FOUP stage moving unit 56 is connected to the control unit 62, and moves the FOUP stage S in, for example, the carrying-in/out direction (X-direction) of a semiconductor wafer W in accordance with a control signal S2 provided from the control unit 62.

The interface part 40 serves as an interface to external manufacturing equipment, and is fixed to the stage moving unit 56 and the base 60 so that the interface part 40 is removable by an unshown engagement member or fitting unit in the present embodiment. A door (not shown) which is actuated in response to the opening and closing of the lid 30 is attached to a position in the surface area of the interface part 40 corresponding to an opening OP360 of the FOUP 200.

The interface part 40 is provided with a plurality of air blow holes 90. As shown in FIG. 8A, the air blow holes 90 are provided around the opening OP360 of the FOUP 200 along the outer circumferential surface of the FOUP 200.

The air blow holes 90 are joined to the clean air cylinder 80 via a pipeline P and the valve V. The valve 82 is attached to the valve V. The opening and closing of the valve 82 and the adjustment of its opening degree are manually or automatically performed. The control unit 62 is also connected to the clean air cylinder 80, and generates a control signal S31 to control the opening and closing of the clean air cylinder 80.

Figure 9:
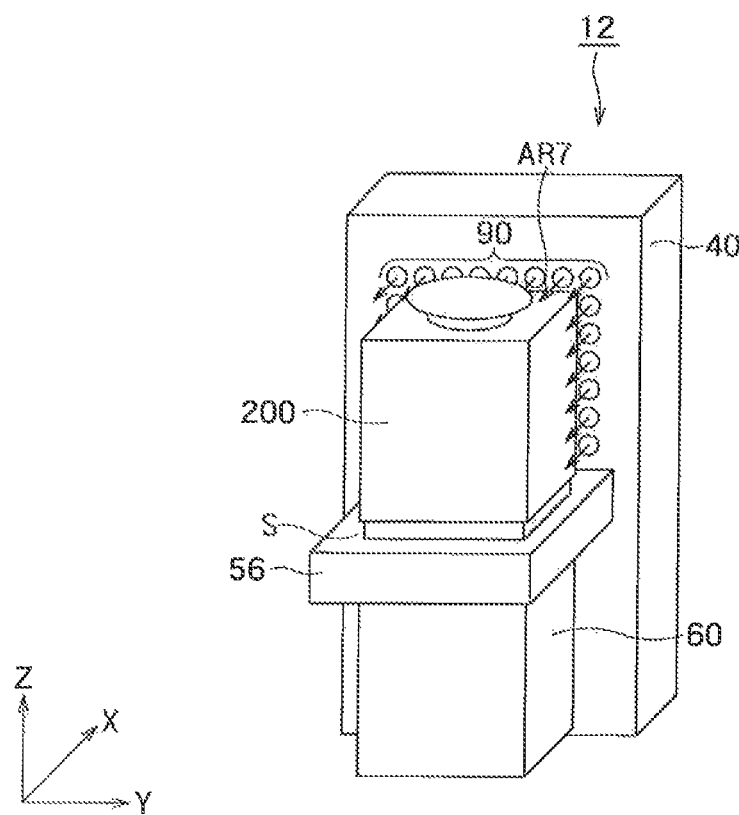
FIG. 9 is a diagram showing an example of how clean air blows from air blow holes in the substrate storage container mounting table shown in FIGS. 8A and 8B.

FIG. 9 shows how the clean air cylinder 80 opens in response to the control signal S31 from the control unit 62, and clean air blows from the air blow holes 90 via the valve V and the pipeline P. The clean air blows in the area around the FOUP 200 along the outer circumferential surface of the FOUP 200, and an air curtain is thereby formed as indicated by an arrow AR7, so that the clearance between the manufacturing equipment and the FOUP 200 is closed. As a result, the entrance of outside air into the FOUP 200 can be prevented even without the blocking mechanism according to the first embodiment described above.

Now, one operational example of the substrate storage container mounting table 12 according to the present embodiment is described with reference to FIGS. 10A to 10G.

The substrate storage container mounting table 12 according to the present embodiment is attached to the external manufacturing equipment in use during operation.

The FOUP 200 storing the semiconductor wafer W is carried to the substrate storage container mounting table 12 by, for example, an automatic carrying vehicle (not shown) or a person, and mounted on the FOUP stage S and then waits for processing (FIG. 10A).

When a signal S11 (see FIG. 8B) informing that the manufacturing equipment has prepared for processing is sent to the control unit 52 from the manufacturing equipment or by an operator, the control unit 52 generates a control signal S31 and sends the control signal S31 to the clean air cylinder 80. The clean air cylinder 80 which has received the control signal S31 opens and discharges clean air to the pipeline P. When the valve 82 is opened automatically or by the operator, the clean air from the clean air cylinder 80 blows from the air blow holes 90 as indicated by the arrow AR7, so that an air curtain is formed in a region extending from the outer circumferential surface of the FOUP 200 to the periphery (FIG. 10B).

When the blow of the clean air starts, the control unit 62 generates the control signal S2 (see FIG. 8B) and sends the control signal 52 to the stage moving unit 56. The stage moving unit 56 which has received the control signal S2 moves the FOUP 200 toward the manufacturing equipment as indicated by an arrow AR4 in FIG. 10C. The stage moving unit 56 stops the movement in response to a stop signal S4 (see FIG. 8B) from the control unit 62 at the stage where the FOUP 200 has abutted on the wall surface of the interface part 40 (docked state).

After the FOUP 200 has moved to the wall surface of the manufacturing equipment, the lid 30 of the FOUP 200 is opened by a lid opener/closer (not shown). At the same time, the clearance between the manufacturing equipment and the FOUP 200 is closed by the air curtain formed by the clean air blowing from the air blow holes 90 (FIG. 10D).

In this state, the semiconductor wafer W in the FOUP 200 is carried into the manufacturing equipment, and processed in the manufacturing equipment. If the processing of the semiconductor wafer W is finished and the semiconductor wafer W is again stored in the FOUP 200, the lid 30 is closed by the opener/closer (not shown) (FIG. 10E).

The manufacturing equipment generates a signal S13 (FIG. 8B) informing of the completion of the lid closing operation by the opener/closer (not shown), and sends the signal S13 to the control unit 62. Accordingly, the control unit 62 generates a control signal S33 and sends the control signal S33 to the clean air cylinder 80. The clean air cylinder 80 which has received the control signal S33 is closed, so that the blow of the clean air stops (FIG. 10F).

The control unit 62 generates a control signal S6 simultaneously with the control signal S33 and sends the control signal S6 to the stage moving unit 56, and the stage moving unit 56 moves the FOUP stage S in a direction indicated by an arrow AR6. As a result, the FOUP 200 returns to the original position (undocked state) (FIG. 10G). The FOUP 200 which has returned to the original position is carried to manufacturing equipment for the next processing step.

Thus, the substrate storage container mounting table 12 according to the present embodiment creates the air curtain while controlling the blow of the clean air from the air blow holes 90 by the docking/undocking timings instead of using the physical blocking plate 50 in Embodiment 1. Therefore, intake of dust can be prevented.

The substrate storage container mounting table according to at least one embodiment described above has the blocking mechanism or an air curtain forming mechanism which prevents the entrance of the outside air into the substrate storage unit 20 synchronously with the docking/undocking operations of the FOUP 200. Therefore, the decrease of product yield can be prevented. Moreover, if the FOUP 1 according to the embodiment described above is used together, intake of dust by the outside air can be prevented to the maximum.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions.

For example, although control of the moving of the stage moving unit 56 based on the measurement result by the sensor 72 has been only described above in Embodiment 1, it should be understood that the embodiments are not limited to this and such moving control can also be added to Embodiment 2. Moreover, it is possible to prevent the entrance of polluted outside air into the FOUP not only by using the blocking mechanism or the air curtain forming control mechanism described in Embodiments 1 and 2 together but also by solely using the control of the moving of the stage moving unit 56 based on the measurement result by the sensor 72.

The accompanying claims and their equivalents are intended to cover such forms or modifications as would fall within the scope and spirit of the inventions.

The invention claimed is:

1. A substrate storage container mounting table comprising:
a base to mount an external substrate storage container, the substrate storage container comprising an opening to take in or out a substrate, and a lid configure to close the opening; and
a blocking mechanism configured to block the substrate storage container from external air in response to the opening of the lid
wherein the blocking mechanism comprises
a blocking plate movable in a direction crossing a surface of the base, the opening is comprised on the surface, and configured to cover at least a part of the substrate storage container around the opening,
a blocking plate moving unit configured to move the blocking plate, and
a control unit configured to control the blocking plate moving unit.

2. The mounting table of claim 1, further comprising:
an interface part configured to serve as an interface between the substrate storage container and external equipment;
a movement mechanism configured to move the substrate storage container; and
a distance adjustment mechanism configured to adjust the distance between the lid and the interface part.

3. The mounting table of claim 2,
wherein the distance adjustment mechanism comprises
a distance measurement unit configured to measure the distance between the lid and the interface part,
a judging unit configured to judge whether a measurement result by the distance measurement unit is acceptable, and
the control unit controls the movement mechanism in accordance with a judgment result by the judging unit.

4. The mounting table of claim 2,
wherein the distance adjustment mechanism comprises
a contact pressure measurement unit configured to measure the contact pressure between the lid and the interface part,
a judging unit configured to judge whether a measurement result by the contact pressure measurement unit is acceptable, and
the control unit controls the movement mechanism in accordance with a judgment result by the judging unit.

5. The mounting table of claim 2, further comprising a buffer material provided on a surface facing the substrate storage container among surfaces of the interface part.

6. A substrate storage container mounting table comprising:
a base to mount an external substrate storage container, the substrate storage container comprising an opening to take in or out a substrate, and a lid configured to close the opening; and
an air curtain forming mechanism configured to blow air toward the periphery of the substrate storage container.

7. The substrate storage container mounting table of claim 6, wherein the air curtain forming mechanism forms an air curtain on the base by blowing the air toward the periphery of the substrate storage container.

* * * * *